United States Patent [19]

Goshgarian

[11] 3,801,938

[45] Apr. 2, 1974

[54] PACKAGE FOR MICROWAVE SEMICONDUCTOR DEVICE

[75] Inventor: Haig Goshgarian, Woodlane Hills, Calif.

[73] Assignee: TRW Inc., Los Angeles, Calif.

[22] Filed: May 31, 1972

[21] Appl. No.: 258,158

[52] U.S. Cl. ....... 333/84 M, 174/DIG. 3, 174/15 R, 174/52 S, 317/234 A, 317/234 G

[51] Int. Cl. .......... H05h 5/00

[58] Field of Search .......... 174/52 S, 52 PE, DIG. 3, 174/DIG. 5, 15 R; 317/101 A, 101 CP, 234 A, 234 G; 333/84 M, 84 R

[56] References Cited

UNITED STATES PATENTS

| | | | |
|---|---|---|---|
| 3,515,959 | 6/1970 | Robinson | 317/234 G |
| 3,649,872 | 3/1972 | Garboushian | 174/52 S X |
| 3,651,434 | 3/1972 | McGeogh et al. | 174/52 S X |
| 3,681,513 | 8/1972 | Hargis | 174/52 S |
| 3,683,241 | 8/1972 | Duncan | 174/52 S X |

*Primary Examiner*—Darrell L. Clay

[57] ABSTRACT

A package for holding a microwave semiconductor device adapted for use with strip transmission line. A multilayer structure is assembled upon a conductive header, the elements of the multilayer structure having metallized surfaces thereon for making contact to the microwave semiconductor device. The input and output to the package are adapted for use with strip transmission line configurations, the multilayer structure providing electrical and thermal conductive paths and adapting the package for impedance matching operations.

10 Claims, 7 Drawing Figures

PACKAGE FOR MICROWAVE SEMICONDUCTOR DEVICE

BACKGROUND OF THE INVENTION

1. Field of the Invention

The present invention generally relates to semiconductor packages and, more specifically, to those packages adapted for use with microwave devices.

2. Prior Art

The use of semiconductor devices for operation at high frequencies has greatly increased as heat dissipation, size and other characteristics of the devices have been improved to meet the exacting criteria required for such applications. The term "high frequency" as used herein shall hereinafter be understood to mean frequencies in the range of 2 – 4 Gigahertz and higher. Although the present invention package is suitable for use at high frequencies, the scope of the present invention includes applications below the stated frequency range. In addition to the physical characteristics of the semiconductor devices disclosed by the prior art, those devices also exhibit properties which are deleterious to adequate operation at high frequencies and at high power levels. Typical of the problems arising in the devices disclosed by the prior art are parasitic or spurrious oscillations, cross talk between elements, unwanted harmonic distortion and inadequate isolation between input and output circuits. When operating at high frequencies, the problems exhibited by those devices disclosed by the prior art can be substantially resolved by improvement of the physical packaging as well as proper selection of the topological geometry of the semiconductor elements and the lead metallization patterns.

A typical device disclosed by the prior art employs a thermally conducting ceramic member with a metallized layer on the bottom surface thereof to act as a ground plane and several metallized layers on the top surface thereof were metallized apertures are disposed from the top to the bottom surface of the ceramic member electrically connecting some of the metallized layers on the top surface of the ceramic member with the metallized layer on the bottom surface thereof. Typically, a semiconductor wafer fabricated as a transistor is affixed to one of the metallized layers on the top surface which is not electrically connected to the bottom surface, an active region of the transistor being electrically connected to that metallized layer i.e., the collector. A staple or other conducting member is bridged across and connected to the metallized layers in electrical contact with the bottom surface of the ceramic member, the base region of the semiconductor wafer being connected to the contacting member and therefore to the ground plane. The excessive lead lengths and distances to the ground plane results in properties which degrade the operation of the device when same is operating at high frequencies. Spurrious or parasitic oscillations can arise because some part of the output of the device is inadvertently being fed back to the input. Feedback may occur through interlead capacitances, excessive lead inductance, stray wiring inductance and capacitance, etc., the exact path often being difficult to determine. At high frequencies, the energy at the input and output of the circuit is between the conductor and the ground plane, therefore, in those devices disclosed by the prior art, the input is coupled to the output through the dielectric, i.e., the ceramic member.

Another device disclosed by the prior art for use with microwave devices uses a multilayer, hermetically sealed package requiring a number of electrically coupled metallized surfaces for providing a common potential barrier about the semiconductor device. The configuration of the metallized surfaces must be changed to adapt to the particular semiconductor element or configuration being utilized therefore requiring complex deposition process steps which are altered depending upon the application and the microwave device being used.

The present invention substantially has solved the problems inherent in those devices disclosed by the prior art. The present invention package comprises a multilayer structure fabricated upon a conductive header, the multilayer structure including a pair of metallized, thermally conductive layers which combine to provide a simplified and easy method for coupling a semiconductor device irrespective of its form, e.g., diode, transistor. The metallized surfaces of the ceramic members remain constant irrespective of the application, the present invention package providing facilities for proper connections no matter what type of semiconductor device or configuration is being mounted within the package.

SUMMARY OF THE INVENTION

The present invention constitutes a hermetically sealed package for microwave, semiconductor devices. A conductive header having a pedestal thereon, receives a multilayer structure adapted to provide both electrical and thermal conductive paths. A pair of thermally conducting, electrically isolating members having apertures disposed therein are coupled to the mounting pedestal, the thermally conductive members having metallized surfaces thereon for making contact with the semiconductor device. The lower thermally conductive member has a pair of metallized surfaces thereon, the metallized surfaces being isolated from each other and being on the top surface of the lower thermally conductive member. The bottom surface of the upper thermally conductive member has a pair of oppositely disposed metallized surfaces on the bottom portion thereof, each of the metallized surfaces on the bottom portion of the upper thermally conductive member contacting one of the isolated metallized regions on the lower thermally conductive member.

The semiconductor device is mounted upon a ceramic insert having high thermal conductive properties. The ceramic insert has a central metallized layer on the top surface thereof, a second metallized surface being isolated from the central metallized layer extending from the top surface of the insert and uniformly covering the transverse side surfaces thereof and the bottom surface of the insert. When the semiconductor device is mounted upon the central metallized layer of the ceramic insert, contact will be made between the body region of the semiconductor device and the central metallized surface of the insert. Depending upon the form of the semiconductor device, connections can be made between one of the other regions of the device to the other metallized surface of the insert therefore provide for at least two electrical contacts to the semiconductor device. The ceramic insert is mounted upon the pedestal of the conductive header, the header providing a common potential barrier at the level of the connected active region of the semiconductor device.

Where the semiconductor device has more than a pair of regions, proper connections are made between the semiconductor device and the metallized layers of the lower thermally conductive member of the multilayer structure and from the metallized layers of the ceramic insert to the remaining metallized layers of the lower thermally conductive member.

The multilayer structure provides means for hermetically sealing the package and closing the semiconductor device. In addition, strip line contacts for the input and output circuits of the package are connected at a common plane thereby equalizing the impedance between the ground plane and the input and the output of the respective circuits.

It is therefore an object of the present invention to provide an improved package for microwave semiconductor devices.

It is another object of the present invention to provide a microwave package adapted for use with varying forms of semiconductor devices.

It is still another object of the present invention to provide a package for microwave semiconductor devices having improved isolation between input and output circuits.

It is yet another object of the present invention to provide a package for a microwave semiconductor device with improved frequency and power characteristics.

It is still yet another object of the present invention to provide a package for microwave, semiconductor devices which is economical and simple to fabricate.

The novel features which are believed to be characteristic of the invention, both as to its organization and method of operation, together with further objectives and advantages thereof, will be better understood from the following description considered in connection with the accompanying drawing in which a presently preferred embodiment of the present invention is illustrated by way of example. It is to be expressly understood, however, that the drawing is for the purpose of illustration and description only, and is not intended as a definition of the limits of the invention.

DESCRIPTION OF THE PRESENTLY PREFERRED EMBODIMENT

Figure 1:
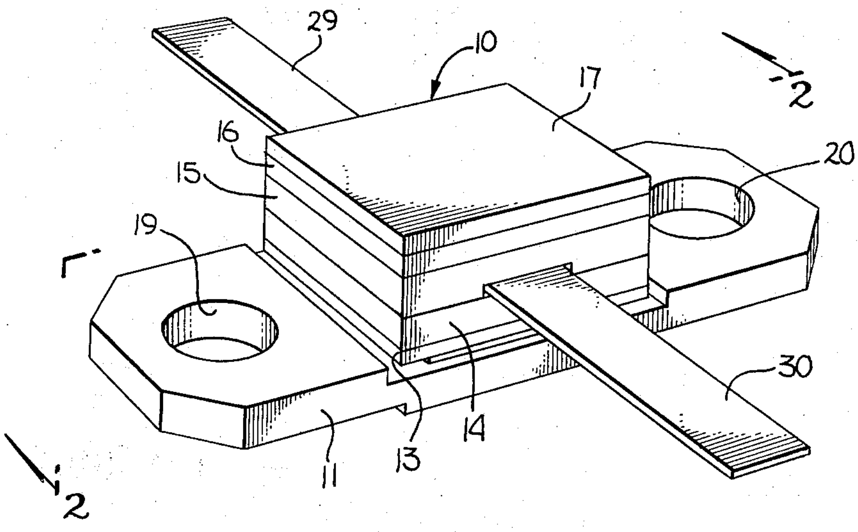
FIG. 1 is a perspective view of a microwave package in accordance with the present invention.

Because of the actual size of the present invention, and for the ease of explanation, the microwave package shown in the drawing is shown in expanded size. The metallized layers disposed on the members of the present invention are shown in double line, it being understood that the conductive or metallized layers are very thin and are disposed thereon by conventional processes such as vacuum evaporation.

An understanding of the prest invention can be best gained by reference to FIG. 1 wherein a perspective view of the present invention package is shown therein generally designated by the reference numeral 10. The present invention package 10 comprises a multilayer structure constructed upon conductive header 11. The multilayer structure shown in FIG. 1 is mounted upon pedestal 12 which can be seen in FIG. 2 and comprises spacer member 13, lower thermally conductive member 14, upper thermally conductive member 15, sealing member 16 and cap 17. As will be explained in detail hereinbelow, the semiconductor device being used with the present invention package is mounted with the multilayer structure defined hereinabove.

Conductive header 11 is preferably constructed of oxygen-free, high conductivity copper. The use of oxygen-free, high conductivity copper is preferred because the fabrication of the present invention package is typically carried out by utilizing a brazing process in a reducing atmosphere or one of the conventional forming gas. If oxygen was present in the copper at the time of brazing, there could be a reaction thereby causing the copper to swell and produce brazing voids therein. The presence of brazing voids within conductive header 11 could result in degraded thermal and electrical properties for the finished product. Although copper is preferably used for the fabrication of conductive header 11, it is understood that additional, electrically conductive materials could be used for fabrication of conductive header 11.

Conductive header 11 has a depressed region 18 uniformly disposed along a portion of the top surface thereof, pedestal 12 depending upwardly from depressed region 18. Pedestal 12 mitigates the deleterious results which could arise from the difference in the coefficient of thermal expansion of conductive header 11 and the thermally conductive insert used for mounting the semi-conductor device. The insert is typically fabricated from a ceramic such as beryllia which has a coefficient which is substantially smaller than that of copper. The reduced surface area of pedestal 12 will mitigate the effects of this difference. The form of conductive header 11 shown in FIG. 1 is a substantially flat plate having apertures 19 and 20 disposed therethrough at the longitudinal ends thereof. The form of conductive header 11 shown in FIG. 1 is used for mounting the present invention package 10 within a strip transmission line circuit. Where the plate form of conductive header 11 is not needed, header 11 could be fabricated as a stud, washer or other configuration suitable for the particular application.

Figure 2:
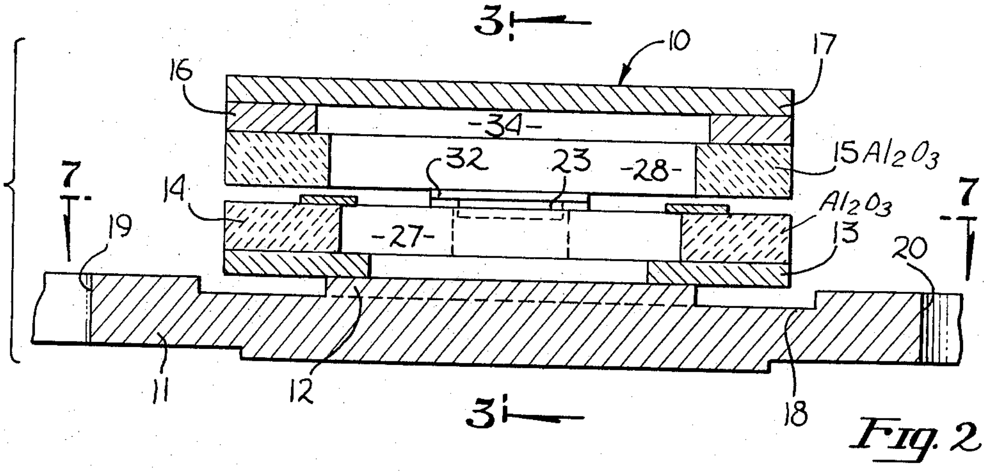
FIG. 2 is a cross-sectional assembly view of the microwave package shown in FIG. 1 taken through line 2—2 of FIG. 1.
Figure 3:
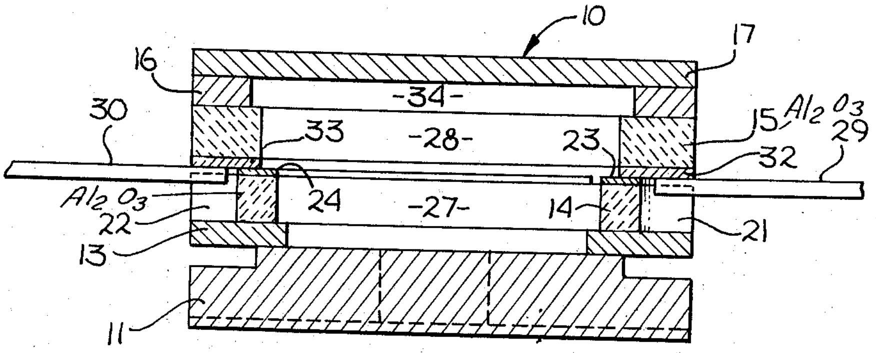
FIG. 3 is a cross-sectional assembly view of the microwave package shown in FIG. 1, taken through line 3—3 of FIG. 2.

Spacer 13 can be best seen by reference to FIG. 2 and FIG. 3. Spacer 13 is a conductive member and is mounted upon pedestal 12. Spacer 13 has an aperture disposed therethrough which is smaller than the outer dimensions of pedestal 12. Spacer 13 is typically fabricated of an electrically and thermally conductive material such as Kovar, but other conventional conductive materials could also be used to fabricate spacer 13.

Figure 4:
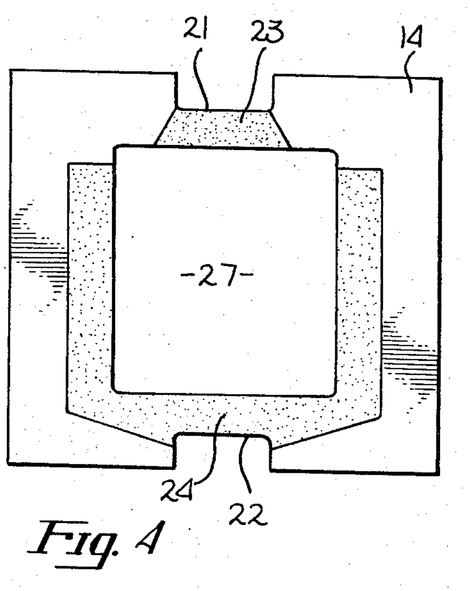
FIG. 4 is a top plan view of the lower thermally conductive member of FIG. 1.

Lower thermally conductive member 14 is disposed upon and secured to spacer 13 and can be best seen by reference to FIG. 2, FIG. 3 and FIG. 4. Lower thermally conductive member 14 has an aperture 27 disposed therein which encompasses the aperture disposed through spacer 13. As can be seen in FIG. 4, depressions 21 and 22 are disposed into the side surfaces of thermally conductive member 14 on opposite sides of aperture 27 disposed therethrough. Metallized, conductive regions 23 and 24 are disposed on top surface 25 of thermally conductive member 14. Metallized region 23 is a coating disposed by conventional processes such as vacuum evaporation. Metallized region 23 extends between depression 21 and the peripheral edge of aperture 27 through thermally conductive member 14, metallized region 24 also extending about the remaining two sides of aperture 27. Metallized region 24 is electrically isolated from metallized region 23 as shown in FIG. 3. Metallized regions 23 and 24 are conventional contact materials such as gold. Thermally conductive member 14 is fabricated from a thermally conducting, electronically insulating ceramic material such as alumina ($Al_2O_3$).

Figure 5:
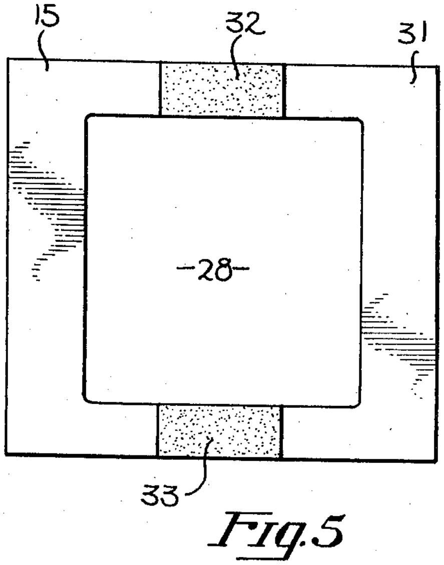
FIG. 5 is a bottom plan view of the upper thermally conductive member shown in FIG. 1.

Upper thermally conductive member 15 can be best seen by reference to FIG. 5. Upper thermally conductive member 15 has aperture 28 disposed therethrough, aperture 28 encompassing aperture 27 in thermally conductive member 14. Thermally conductive member 15 provides a substantially simplified method for coupling strip line contacts 29 and 30 shown in FIG. 1 and FIG. 3. Bottom surface 31 of thermally conductive member 15 can be best seen by reference to FIG. 5. Metallized regions 32 and 33 are disposed on bottom surface 31 of thermally conductive member 15 and adapted to be aligned with portions of metallized regions 23 and 24 respectively. When thermally conductive member 15 is mounted upon and coupled to thermally conductive member 14, metallized region 32 will be in electrical contact with metallized region 23 and metallized region 33 will be in electrical contact with metallized region 24. This can be best seen by reference to FIG. 3. Strip line contact 29 is disposed within depression 22 and coupled to metallized region 33. Strip line contact 30 is disposed within depression 21 and coupled to metallized region 32. Thermally conductive member 15 is fabricated from a thermally conductive, electrically insulating material such as a ceramic, thermally conductive member 15 preferably being fabricated from alumina ($Al_2O_3$).

Sealing member 16 is mounted upon thermally conductive member 15, sealing member 16 having aperture 34 disposed therethrough, aperture 34 encompassing aperture 28. Sealing member 16 is preferably fabricated of an electrically conductive material such as Kovar, although the scope of the present invention encompasses the use of other conventional materials. Cap 17 is hermetically coupled upon the top surface of sealing member 16 after the semiconductor device is mounted. FIG. 2 and FIG. 3 illustrate, for the purpose of example only, the mounting of cap 17, it being understood that semi-conductor device will be mounted prior to hermetically sealing cap 17.

Figure 6:
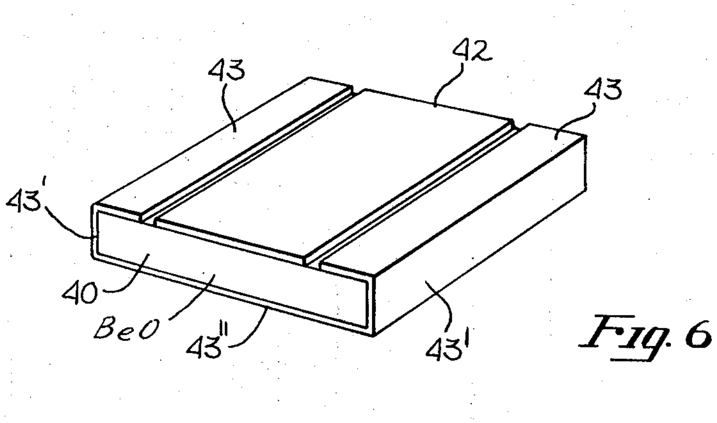
FIG. 6 is a perspective view of a ceramic insert used to mount the semiconductor device within the present invention package.
Figure 7:
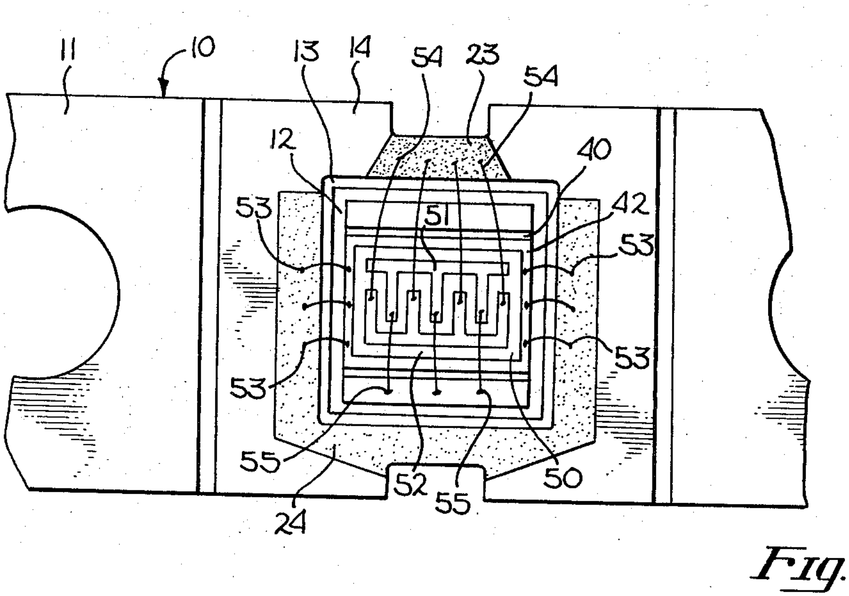
FIG. 7 is a top plan view taken through line 7—7 of FIG. 2 illustrating the mounting of a transistor wafer within the cavity of the present invention package.

The ability of the present invention package 10 to be used for substantially all semiconductor device configurations is best understood by reference to FIG. 6 and FIG. 7. FIG. 6 illustrates insert 40 which provides a mounting member for the semiconductor device. Insert 40 is fabricated from a ceramic material having high thermal conductive properties such as beryllia (BeO) or other suitable dielectrics. Top surface 41 of ceramic insert 40 has disposed thereon central metallized region 42, metallized region 42 being bounded by outer metallized region 43. Metallized regions 43′ extend along the transverse side surfaces of ceramic insert 40, the bottom surface of ceramic insert 40 being uniformly coated with metallized region 43″. Metallized regions 43, 43′ and 43″ uniformly cover the side and bottom surfaces of ceramic insert 40, the boundaries of metallized region 43 encompassing central metallized region 42 but being electrically insulated therefrom.

Referring now to FIG. 7, an exemplary embodiment of the present invention is shown having a mounted transistor. FIG. 7 illustrates the top plan view of the present invention package 10 exposing the interior cavity of package 10 intermediate thermally conductive members 14 and 15. Spacing member 13 is shown mounted upon pedestal 12 of conductive header 11. Within the cavity formed by the aperture in spacing member 13 is disposed ceramic insert 40. Ceramic insert 40 is mounted directly upon the conductive surface of pedestal 12, transistor chip 50 being thermally and electrically secured to central metallized regions 42. Transistor chip 50 is exemplary of semiconductor devices which can be used with present invention package 10. In this case, the body of transistor chip 50 is the collector region of transistor chip 50, the base and emitter regions being properly disposed within the body of transistor chip 50. For the purpose of example, the emitter contact is designated by the reference numeral 51 and the base contact designated by the reference numeral 52, contacts 51 and 52 being disposed on the interdigitated emitter and base regions respectively. It is, of course, understood that the semiconductor device represented by transistor chip 50 could utilize substantially all other forms of semiconductor devices, only the actual connections between the semiconductor device and the present invention package 10 being altered.

In the embodiment of the present invention shown in FIG. 7, the collector region of transistor chip 50 is secured to central metallized region 42 of ceramic insert 40. Bonding leads 53 are connected between central metallized region 42 and metallized region 24 disposed on the top surface of thermally conductive layer 14. Base contact 52 and emitter contact 51 are connected to the appropriate metallized regions utilizing stitch bonding techniques. Base contact 52 is connected to metallized region 23 via contact leads 54. Emitter contact 51 is electrically connected to outer metallized region 43 by interlaced contact leads 55 making all connections to transistor chip 50. With emitter contact 51 electrically coupled to outer metallized region 43, emmiter region 51 is electrically connected to the conductive thereby forming a common emitter configuration for the semiconductor device. It is of course obvious that alteration of the bonding of the active regions of transistor chip and metallized regions 23, 24 and 43 will alter the configuration of the semiconductor device. In the case where the semiconductor device utilizes a diode, only two of the three possible contacts will be utilized.

As an example of an alternative configuration for the present invention package 10, a common collector configuration could be fabricated merely by connecting contact leads between central metallized region 42 and outer metallized region 43, and making appropriate connections between emitter regions 51 and 52 and the respective metallized regions 23 and 24. It can therefore be seen that the present invention package 10 constitutes a universal package for microwave semiconductor devices since the same configuration of metallized regions can be used irrespective of the type of semiconductor device and the manner of implementing same within a circuit.

An advantage of the present invention package 10 arises out of the ability to utilize short contact leads between the regions of the semiconductor device and the respective metallized surfaces. Since insert 40 allows transistor chip 50 (FIG. 7) to be at the same level as metallized surfaces 23 and 24, lead length can be minimized. At the frequencies being utilized by the present invention, excessive lead lengths would produce excessive lead inductance and therefore unwanted parasitic oscillations and distortion. Since the present invention does not require different metallization patterns where the device configuration is changed, the present invention provides a package which is more economical and easier to fabricate than those described in the prior art.

I claim:

1. A package for holding a semi-conductor device having an input, output and common terminal comprising:

a. an electrically conductive header having a pedestal depending upwardly from said header and being integral therewith;

b. a first thermally conductive member having an aperture therethrough coupled to said pedestal, the pedestal of said header being intermediate said aperture and the outer edges of said first thermally conductive member, said first thermally conductive member having transverse depressions on the outer surface thereof on opposite sides of said aperture;

c. first and second metallized regions disposed on said first thermally conductive member opposite said header, said first metallized region being adjacent one of said depressions and extending to the edge of said aperture, said second metallized region being adjacent the other of said depressions and extending to the edge of said aperture to the vicinity of said first metallized region, said first and second metallized regions being electrically isolated from each other;

d. a second thermally conductive member coupled to said first thermally conductive member;

e. third and fourth metallized regions disposed on said second thermally conductive member aligned with and adjacent said first and second metallized regions respectively, said third and fourth metallized regions extending above and being accessible as the input and output terminals of the semiconductor device when said first and second thermally conductive members are coupled to one another; and f. a third thermally conductive member having central and outer metallized regions, said third thermally conductive members being coupled to said header, said outer metallized region being in contact with said header to provide the common terminal, said central metallized region for receiving the semiconductor device.

2. A package as defined in claim 1 including strip line contact leads connected to said third and fourth metallized regions within said depressions.

3. A package as defined in claim 1 wherein said first, second and third thermally conductive members are fabricated from a ceramic.

4. A package as defined in claim 3 wherein said third thermally conductive member is fabricated from beryllia.

5. A package as defined in claim 1 including a microwave device mounted upon the central metallized region of said third thermally conductive member and a cap hermetically coupled to said second thermally conductive member over the aperture through said second thermally conductive member.

6. A package for a microwave device having an input, output and common terminals comprising:

a. an electrically conductive header having a pedestal extending upwardly from said header and being integral therewith;

b. a first thermally conductive member having top, bottom and side surfaces and an aperture therethrough, the bottom surface of said first thermally conductive member being coupled to the pedestal of said header, and having depressions in the side surfaces on opposite sides of said apertures, said pedestal being intermediate said aperture and said side surfaces;

c. first and second metallized layers disposed on the top surface of said first thermally conductive member, said first metallized layer being adjacent one of said depressions and extending to said aperture, said second metallized layer being adjacent the other of said depressions and extending about the periphery of the aperture to the vicinity of said first metallized layer, said first and second metallized layer being electrically isolated from each other;

d. a second thermally conductive member having top and bottom surface and an aperture therethrough circumscribing the aperture through said first thermally conductive member, the bottom surface of said second thermally conductive member being connected to the top surface of said first thermally conductive member;

e. third and fourth metallized layers disposed on the bottom surface of said second thermally conductive member adjacent said first and second metallized layers respectively, said third and fourth metallized layers each extending about one of said depressions;

f. strip line contact leads connected to each of the third and fourth metallized layers within said depression;

g. a third metallized thermally conductive member having top, bottom and side surfaces having a central metallized layer on the top surface thereof for receiving the microwave device and an outer metallized layer bounding said central metallized layer and extending about the side and bottom surfaces thereof, the bottom surface of said third metallized thermally conductive member being connected to the pedestal of said header; and h. means for connecting the regions of said microwave device to said first, second and outer metallized layers.

7. A package as defined in claim 6 including a microwave device mounted upon the central metallized layer and a cap hermetically coupled to said second thermally conductive member over the aperture therethrough.

8. A package as defined in claim 6 wherein said means for connecting comprises interlaced, stitch bonded leads.

9. A package as defined in claim 6 wherein said first, second and third thermally conductive members are fabricated from a ceramic.

10. A package as defined in claim 9 wherein said third thermally conductive member is fabricated from beryllia.

* * * * *